United States Patent
Culver et al.

(10) Patent No.: US 7,329,618 B2
(45) Date of Patent: Feb. 12, 2008

(54) ION IMPLANTING METHODS

(75) Inventors: Randall Culver, Boise, ID (US);
Terrence B. McDaniel, Boise, ID (US);
Hongmei Wang, Centreville, VA (US);
James L. Dale, Woodbridge, VA (US);
Richard H. Lane, Boise, ID (US);
Fred D. Fishburn, Woodbridge, VA (US)

(73) Assignee: Micron Technology, Inc., Boise, ID (US)

( * ) Notice: Subject to any disclaimer, the term of this patent is extended or adjusted under 35 U.S.C. 154(b) by 240 days.

(21) Appl. No.: 11/168,893

(22) Filed: Jun. 28, 2005

(65) Prior Publication Data

US 2006/0292838 A1 Dec. 28, 2006

(51) Int. Cl.
*H01L 21/31* (2006.01)
*H01L 21/265* (2006.01)
*H01L 21/266* (2006.01)

(52) U.S. Cl. ............... 438/780; 438/514; 438/778; 257/E21.026; 257/E21.618

(58) Field of Classification Search ........... 438/377, 438/510, 514, 531, 552, 555, 942, 975, FOR. 317, 438/FOR. 435, FOR. 442, FOR. 459, FOR. 473; 257/E21.026, E21.618
See application file for complete search history.

(56) References Cited

U.S. PATENT DOCUMENTS

| | | | | |
|---|---|---|---|---|
| 3,884,703 A | * | 5/1975 | Oba et al. | 430/196 |
| 4,033,797 A | * | 7/1977 | Dill et al. | 438/227 |
| 5,155,369 A | * | 10/1992 | Current | 438/525 |
| 5,376,578 A | * | 12/1994 | Hsu et al. | 438/289 |
| 6,146,929 A | * | 11/2000 | Oana et al. | 438/151 |
| 6,200,884 B1 | | 3/2001 | Yang et al. | |
| 6,326,300 B1 | * | 12/2001 | Liu et al. | 438/638 |
| 6,420,226 B1 | * | 7/2002 | Chen et al. | 438/238 |
| 6,576,405 B1 | | 6/2003 | Buffat et al. | |

OTHER PUBLICATIONS

US06/020600, May 2006, PCT Written Opinion.
US06/020600, May 2006, PCT Search Rpt.

* cited by examiner

*Primary Examiner*—Fernando L. Toledo
*Assistant Examiner*—Quovaunda Jefferson
(74) *Attorney, Agent, or Firm*—Wells St. John P.S.

(57) ABSTRACT

An ion implanting method includes forming a pair of spaced and adjacent features projecting outwardly from a substrate. At least outermost portions of the pair of spaced features are laterally pulled away from one another with a patterned photoresist layer received over the features and which has an opening therein received intermediate the pair of spaced features. While such spaced features are laterally pulled, a species is ion implanted into substrate material which is received lower than the pair of spaced features. After the ion implanting, the patterned photoresist layer is removed from the substrate. Other aspects and implementations are contemplated.

67 Claims, 9 Drawing Sheets

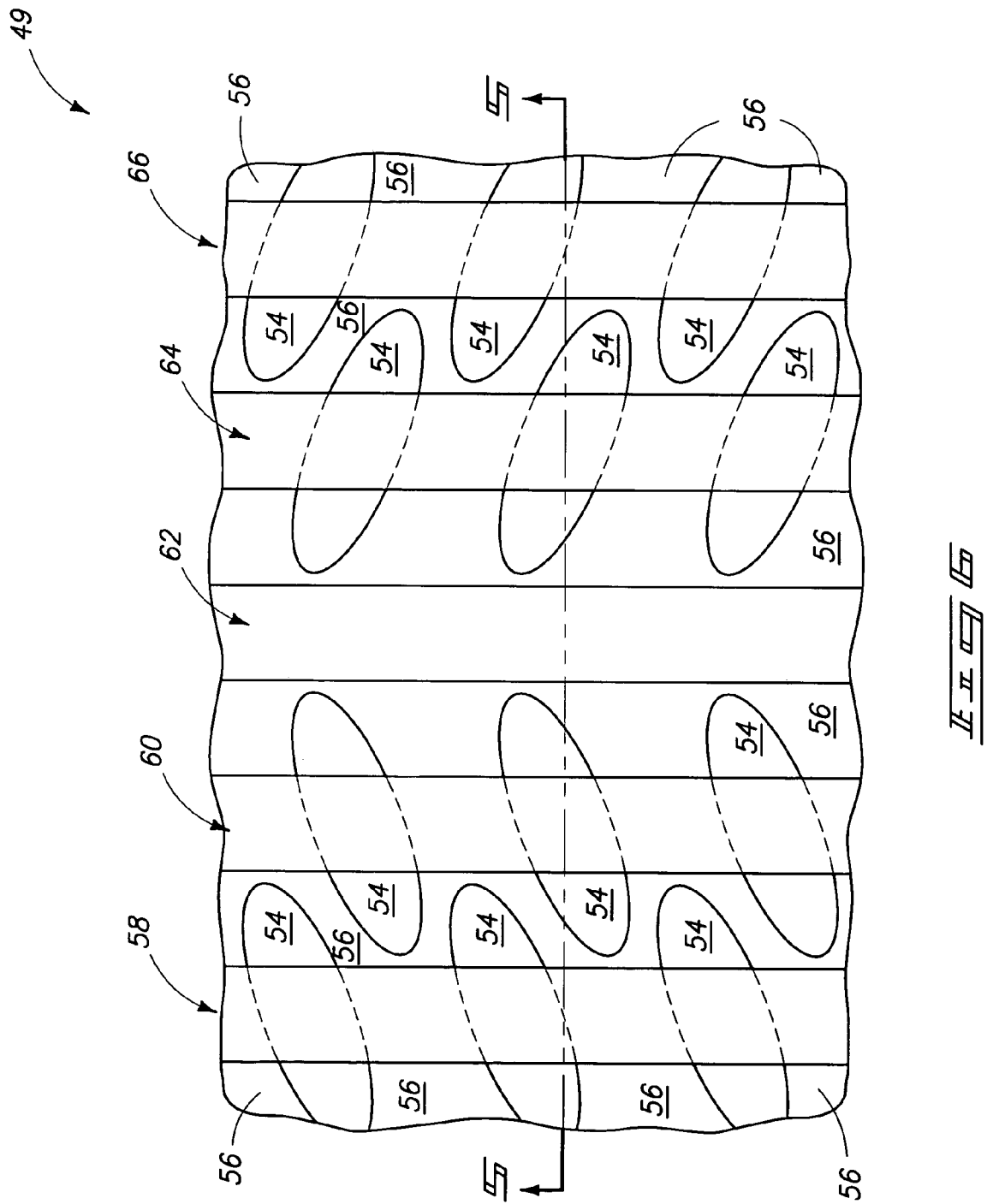

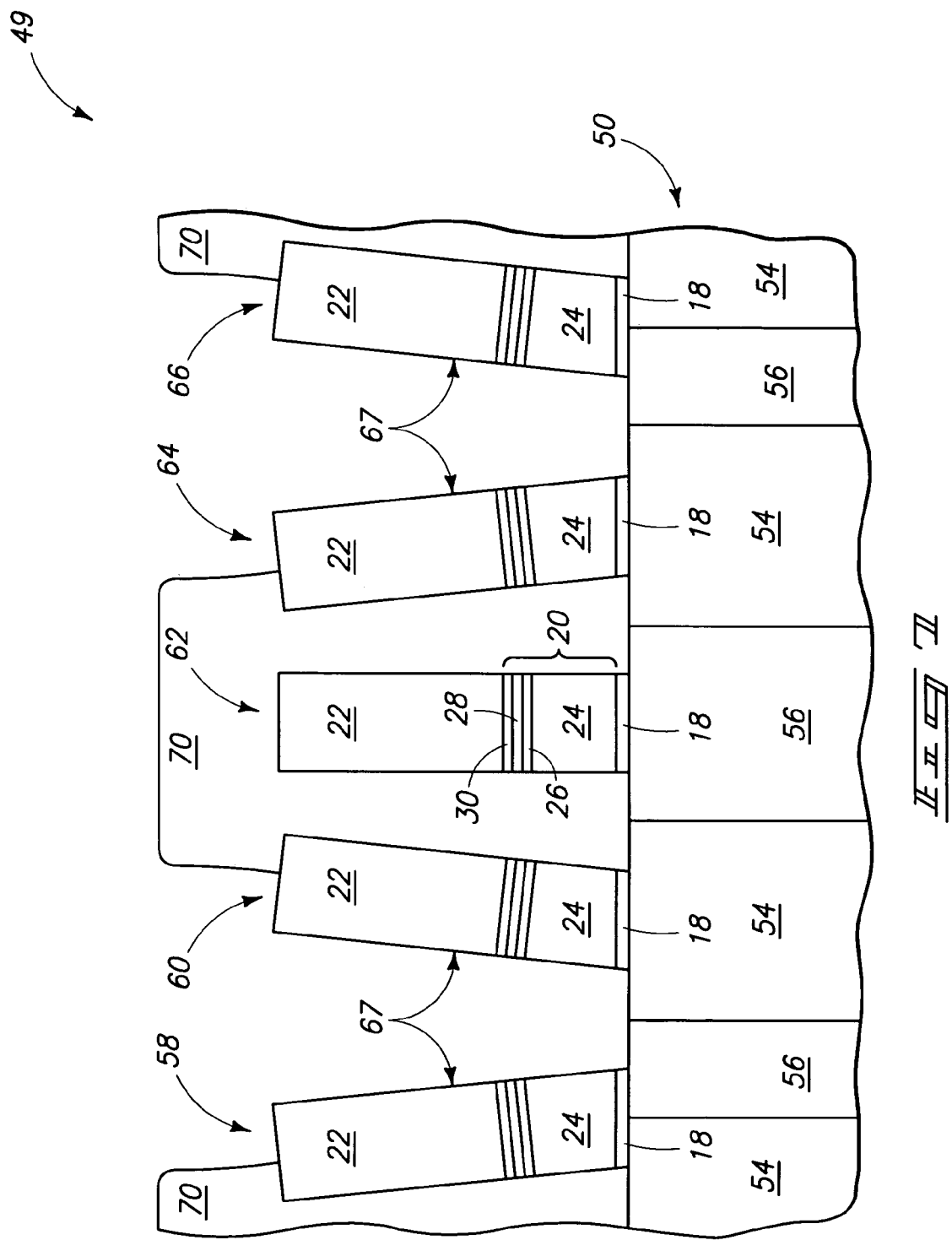

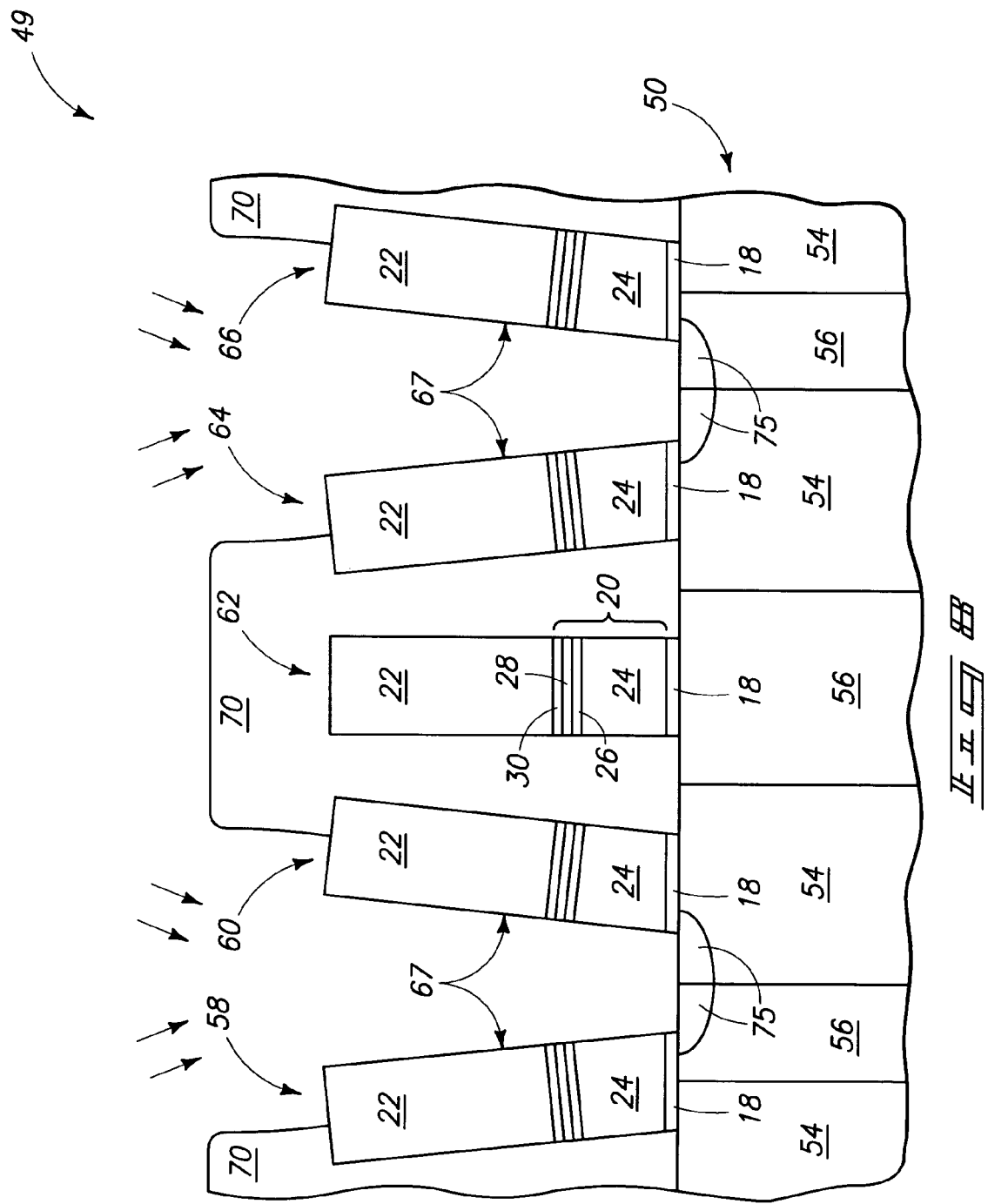

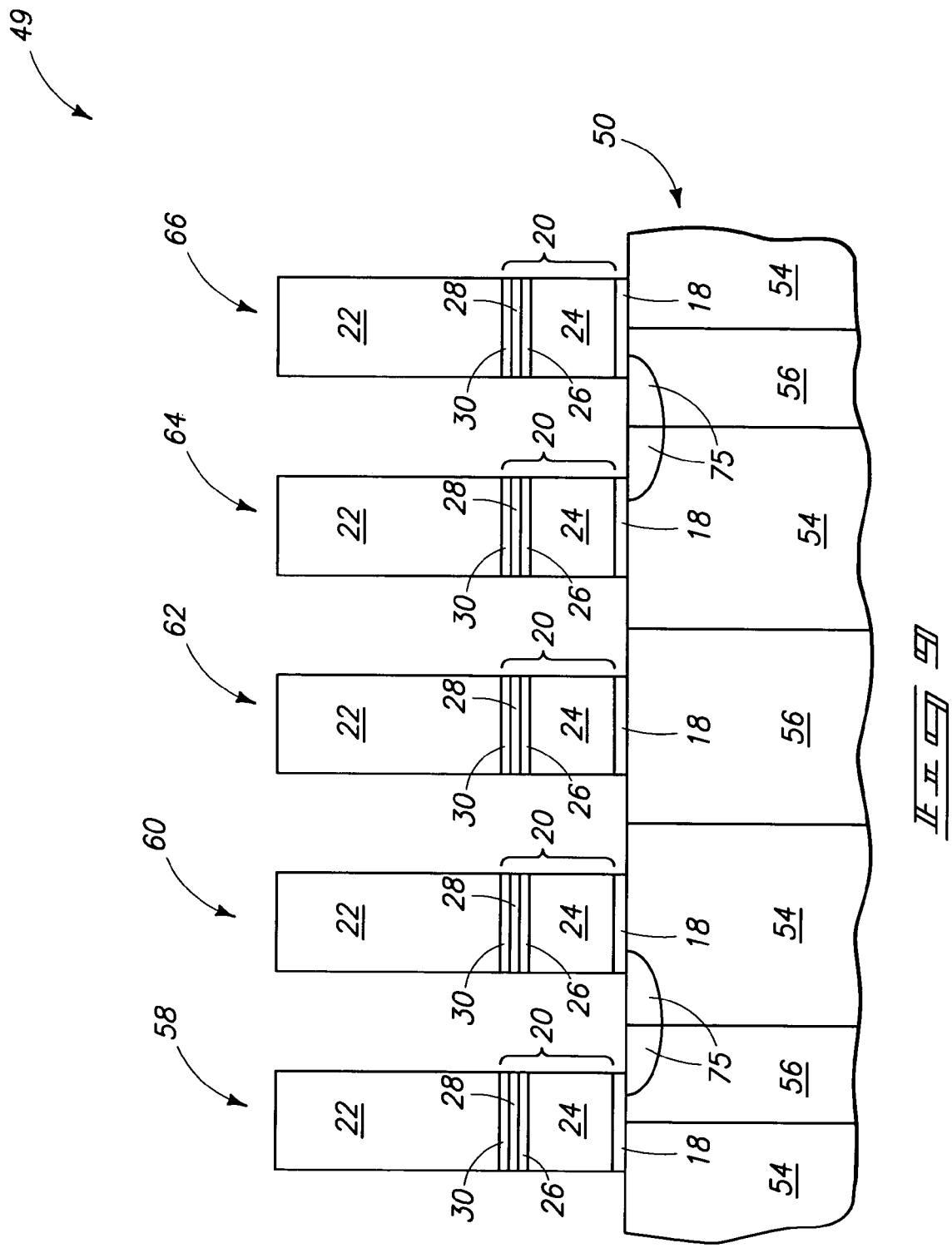

ION IMPLANTING METHODS

TECHNICAL FIELD

This invention relates to ion implanting.

BACKGROUND OF THE INVENTION

Ion implanting is one method whereby material is introduced into a substrate. Energetic, charged atoms or molecules can be implanted into an outer surface region of the substrate, and/or deeper within the substrate depending upon the driving energy imparted to the atoms or molecules. In one typical use, ion implantation introduces conductivity enhancing dopant ions into and through the surface of semiconductor substrates, such as crystalline silicon. By selecting a suitable implant species, an implant dose, and implant energy, the artisan can form desired regions within a substrate.

Many ion implantation techniques drive the implanted species into the substrate from a direction perpendicular/orthogonal to a general/global orientation of the substrate. However in some instances, it is desirable to form an implanted region to be received at least partially beneath a structure or feature which is formed over the substrate. To accomplish the same, ion implanting can be conducted at an angle from orthogonal whereby an implanted region is received at least partially beneath a structure/feature that projects from the substrate. However, a trend within the semiconductor integrated circuitry fabrication industry has been to make the features both taller and closer together. Such can effectively preclude, or at least reduce, the degree to which an angled ion implanting method can effectively provide an implanted region to be received beneath a feature.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes ion implanting methods. In one implementation, an ion implanting method includes forming a pair of spaced and adjacent features projecting outwardly from a substrate. At least outermost portions of the pair of spaced features are laterally pulled away from one another with a patterned photoresist layer received over the features and which has an opening therein received intermediate the pair of spaced features. While such spaced features are laterally pulled, a species is ion implanted into substrate material which is received lower than the pair of spaced features. After the ion implanting, the patterned photoresist layer is removed from the substrate.

In one implementation, an ion implanting method includes forming a pair of spaced and adjacent features projecting outwardly from a substrate. A first set of photoresist processing parameters is determined which would, upon forming a patterned photoresist layer over the features having an opening therein received intermediate the features, result in a first lateral separation of outermost portions of the features of the pair. A patterned photoresist layer is formed over the features using a second set of photoresist processing parameters which results in a second lateral separation of the outermost portions of the features which is greater than the first lateral separation. While the patterned photoresist layer is over the features, a species is ion implanted into substrate material which is received lower than the pair of spaced features. After the ion implanting, the patterned photoresist layer is removed from the substrate.

In one implementation, an ion implanting method includes forming first, second, and third features projecting outwardly from a substrate. The second feature is received intermediate the first and third features. At least outermost portions of the first and third features are pulled laterally inward toward the second feature with a patterned photoresist layer received over the first, second, and third features. The patterned photoresist layer is received entirely over the second feature and bridges between the first and third features. The patterned photoresist layer exposes laterally outer sidewalls of the first and third features. While the first and third features are laterally pulled, a species is ion implanted into substrate material laterally outward of and adjacent the first and third features and which is received lower than the first and third features. After the ion implanting, the patterned photoresist layer is removed from the substrate.

Other aspects and implementations are contemplated.

BRIEF DESCRIPTION OF THE DRAWINGS

Preferred embodiments of the invention are described below with reference to the following accompanying drawings.

FIG. 6 is a top view of FIG. 5, with FIG. 5 being taken through line 5-5 in FIG. 6.

FIG. 7 is a view of the FIG. 5 substrate fragment at a processing step subsequent to that shown by FIG. 5.

FIG. 8 is a view of the FIG. 7 substrate fragment at a processing step subsequent to that shown by FIG. 7.

FIG. 9 is a view of the FIG. 8 substrate fragment at a processing step subsequent to that shown by FIG. 8.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
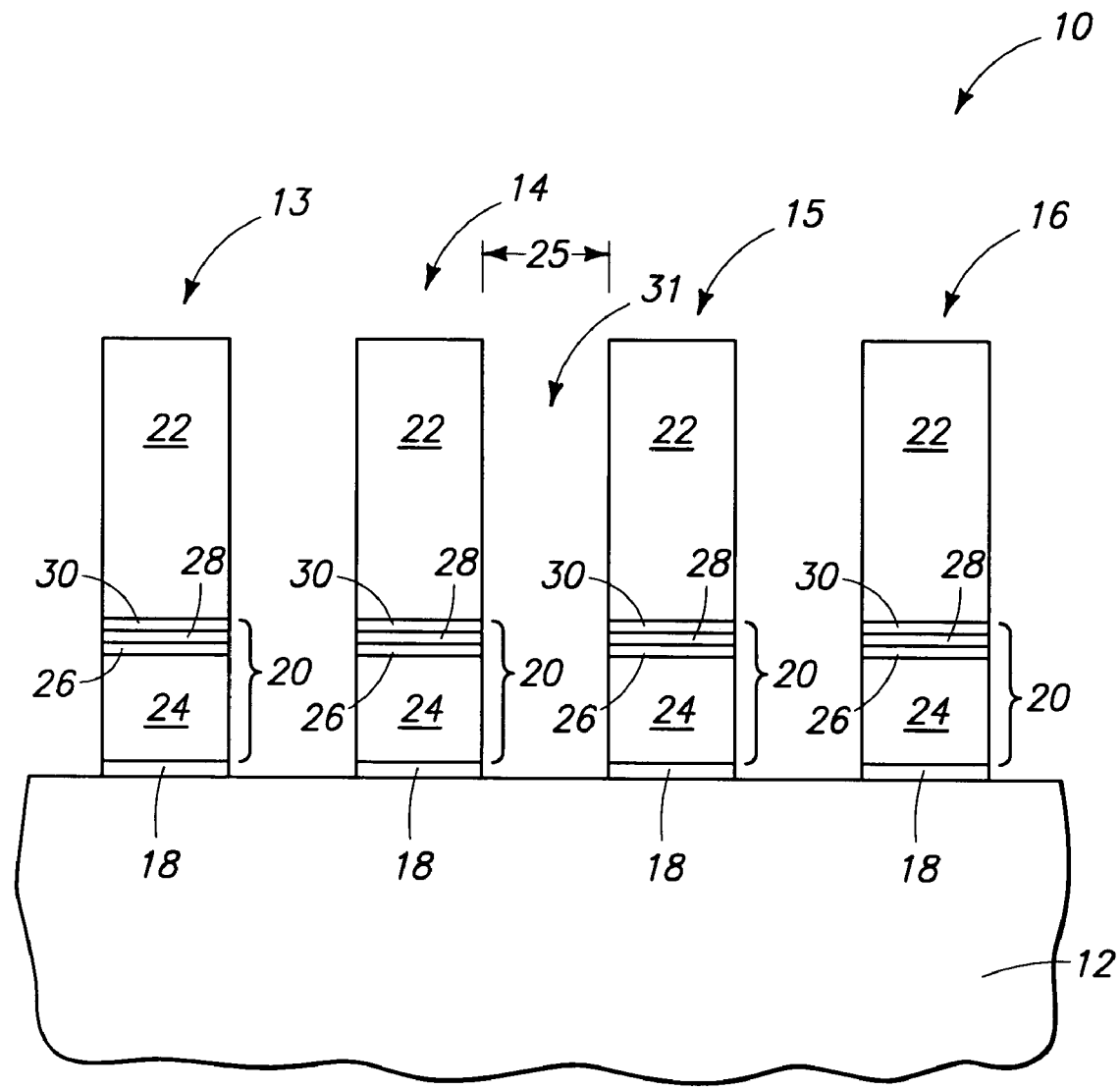
FIG. 1 is a diagrammatic sectional view of a substrate fragment in process in accordance with an aspect of the invention.

First exemplary ion implanting methods in accordance with aspects of the invention are described with reference to FIGS. 1-4. FIG. 1 depicts a substrate fragment indicated generally with reference numeral 10. Such comprises a substrate 12 having a series of features 13, 14, 15 and 16 projecting outwardly therefrom. Substrate 12 might comprise any one or combination of different materials, and in one implementation preferably comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural, unless otherwise indicated. In one exemplary implementation, substrate 12 comprises bulk semiconductive material, for example intrinsically doped monocrystalline silicon. Alternate substrates are of course contemplated, with semiconductor-on-insulator substrates being but one exemplary type.

Features 13, 14, 15 and 16 might be of the same size and shape, or of different at least one of size and shape. In the depicted exemplary embodiment, features 13, 14, 15 and 16 comprise field effect transistor gate stacks comprising a gate dielectric layer 18, a conductive layer 20 and an insulative cap 22. An exemplary preferred gate dielectric layer comprises silicon dioxide provided to an exemplary thickness of 55 Angstroms. An exemplary conductive layer 20 comprises a 700 Angstroms thick polysilicon layer 24, an 85 Angstroms thick elemental titanium layer 26, a 150 Angstroms thick tungsten nitride layer 28, and a 100 Angstroms thick elemental tungsten layer 30. An exemplary preferred insulative cap material comprises silicon nitride, for example provided to an exemplary thickness of 1500 Angstroms. An exemplary width for the individual gate stacks 13, 14, 15 and 16, as well as the separation distance between immediately adjacent gate stacks, is 750 Angstroms. Such thereby provides an aspect ratio of the spacing between the depicted features of about 3.5.

For purposes of the continuing discussion, processing is described with emphasis on features 14 and 15 which, in the exemplary embodiment, can be considered as a pair of spaced and adjacent features projecting outwardly from substrate 12. The processing herein further described is in conjunction with at least one common cross-section within which the subject features are received, and not necessarily with respect to an entirety of the features as received over substrate 12. Outermost portions of the pair of spaced features 14 and 15 can be considered as having a lateral separation distance 25 in the depicted cross-section. In one preferred implementation, the features of the pair have aspect ratios of at least 3.0 and a space therebetween has an aspect ratio of at least 3.0, for example the exemplary depicted space 31 in the depicted cross-section. Further, in one preferred implementation, the features of the pair have aspect ratios of at least 4.0 and a space therebetween having an aspect ratio of at least 4.0.

Figure 2:
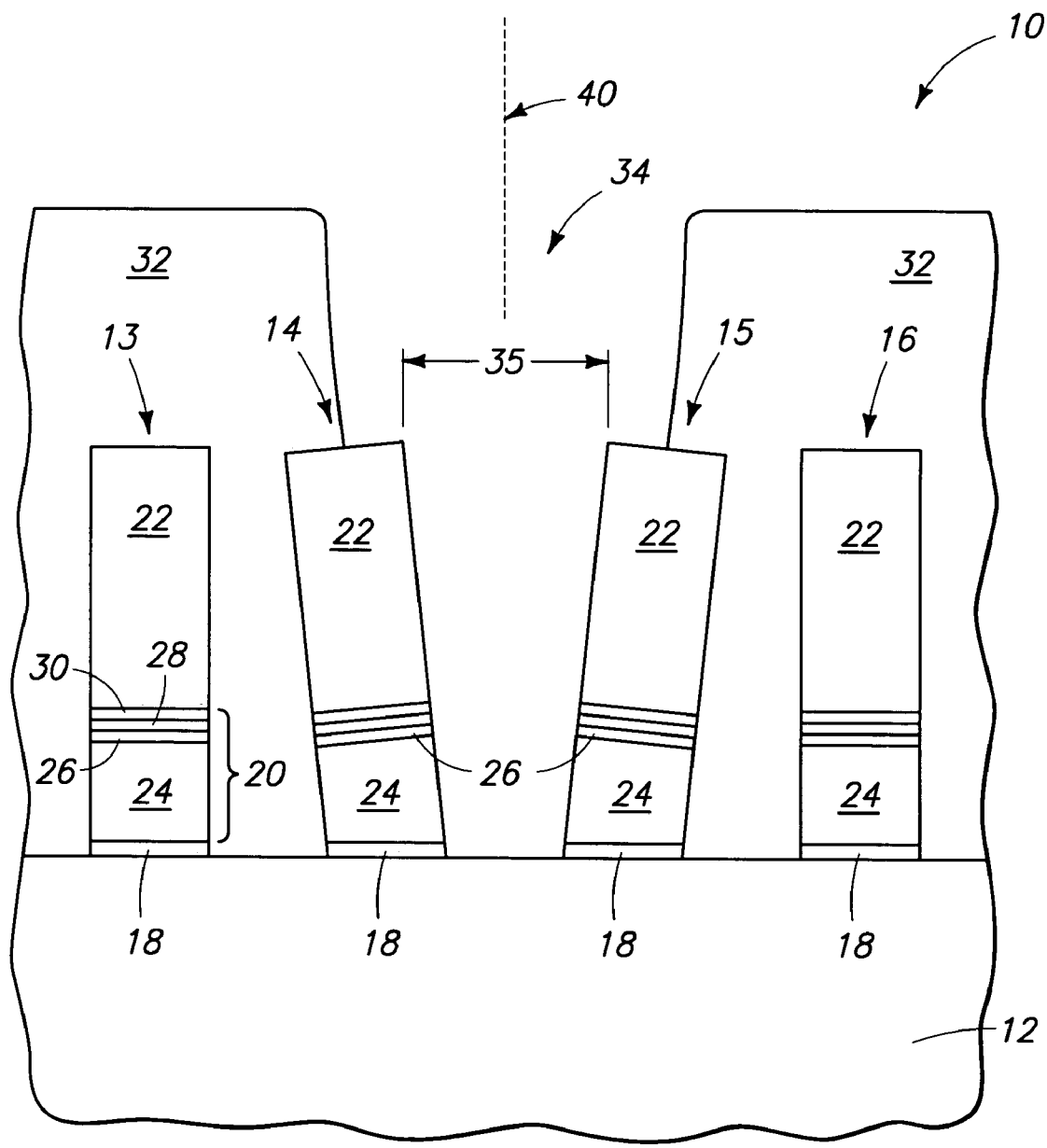
FIG. 2 is a view of the FIG. 1 substrate fragment at a processing step subsequent to that shown by FIG. 1.

Referring to FIG. 2, outermost portions of the pair of spaced features 14 and 15 have been laterally pulled away from one another with a patterned photoresist layer 32 received over features 14 and 15, and wherein photoresist layer 32 has an opening 34 received therein intermediate the pair of spaced features 14 and 15. In the context of this document, photoresist is any material comprising a photoactive compound that undergoes a chemical reaction in response to exposure to actinic energy, or the like, such that the material is capable of patterning using solvent or other processing subsequent to actinic energy exposure. Layer 32 might include materials/layers in addition to photoresist. In one preferred implementation, patterned photoresist layer 32 comprises an organic photoresist.

The invention was reduced-to-practice with the above-described exemplary preferred embodiment utilizing a nominal 3,150 Angstroms thick layer of SEPR701 photoresist available from Shin-Etsu Chemical Co., Ltd.; 6-1, Ohtemachi 2-chome, Chiyoda-ku; Tokyo 100-0004, Japan. Such photoresist was subjected to a pre-exposure bake of 115° C. for 90 seconds, and a post-exposure bake at 110° C. for 90 seconds. The dimension of opening 34 within photoresist layer 32 was nominally selected to be from 0.5 micron to 5 microns wide in the depicted cross-section and from 0.1 micron to 100 microns long. Such resulted in a lateral pulling of each of the features of the pair at 6° from orthogonal to substrate 12 (with orthogonal being shown with numeral 40).

Preferably, the lateral pulling of each of the exemplary features 14 and 15 of the pair is from 1° to 10° from orthogonal to the substrate, with a range of from 5° to 8° from orthogonal to the substrate believed to be more preferred. Further, in one exemplary preferred implementation, patterned photoresist layer 32 is received over less than all of each of features 14 and 15 of the pair. In the depicted exemplary embodiment, the patterned photoresist layer is received over about 50% of each of features 14 and 15 of the pair. The invention also, of course, contemplates the patterned photoresist layer being received over less than 50% of each of the features, as well as over more than 50% of each of the features. FIG. 2 depicts the lateral pulling resulting in a lateral separation 35 of the outermost portions of features 14 and 15 which is greater than that of lateral separation 25.

Figure 3:
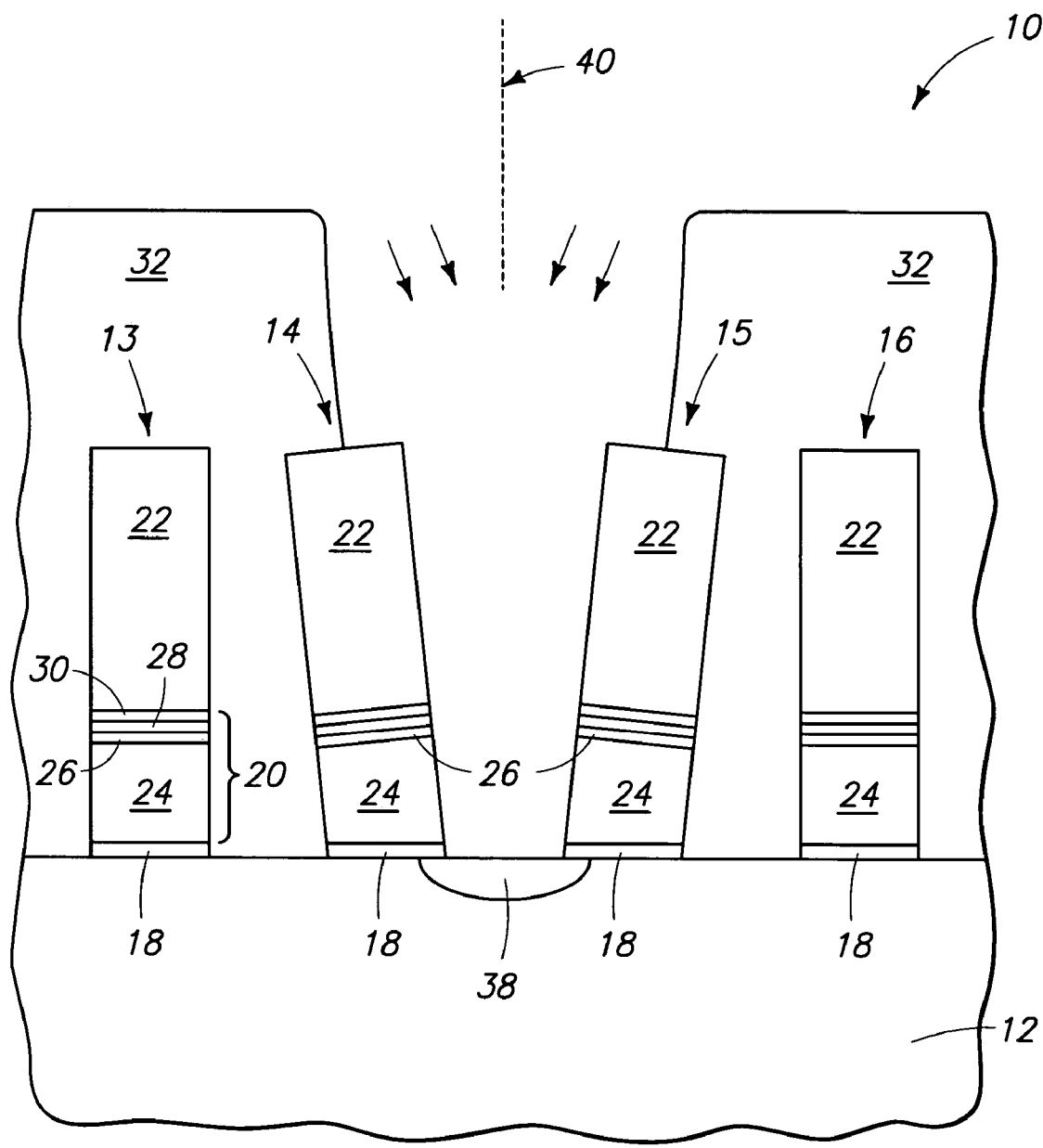
FIG. 3 is a view of the FIG. 2 substrate fragment at a processing step subsequent to that shown by FIG. 2.

Referring to FIG. 3, and with spaced features 14 and 15 being laterally pulled away from one another, a suitable species is ion implanted into the material of substrate 12 which is received lower than the pair of spaced features 14 and 15. Such is depicted as forming an exemplary diffusion region 38. In one exemplary implementation, the implanted species comprises a conductivity enhancing dopant, for example either boron or arsenic implanted to an exemplary dose of from $1\times10^{11}$ species/cm$^2$ to $1\times10^{15}$ species/cm$^2$. Such ion implanting might be generally orthogonal to the substrate, whereby the implanted species and region are received lower than the pair of spaced features 14 and 15, but not also thereunder at least as-implanted. Accordingly, "lower" by itself in the context of this document does not require implanting to directly beneath a feature. However alternately, and more preferably in accordance with overcoming the issues which motivated the invention, the ion implanting is conducted at some angle from orthogonal to the substrate (i.e., at 1° to 10° from orthogonal), and accordingly is also into some substrate material received directly beneath features 14 and 15 as-implanted. For example, FIG. 3 depicts exemplary arrows that angle from orthogonal direction 40 from substrate 12, and wherein at least some of the depicted diffusion region 38 is received at least partially beneath features 14 and 15. Accordingly in one implementation, laterally pulling at least the outermost portion of the pair of spaced features provides greater room to enable an angled ion implant to occur relative to substrate material over which features 14 and 15 are received, and regardless of whether the implanted species is received directly beneath the projecting features. The angle of ion implanting, if other than orthogonal, might be at the same angular degree of the outermost portions of the pair of features resulting from the pulling, or might be at an angle greater of less than such angular degree of pulling.

Figure 4:
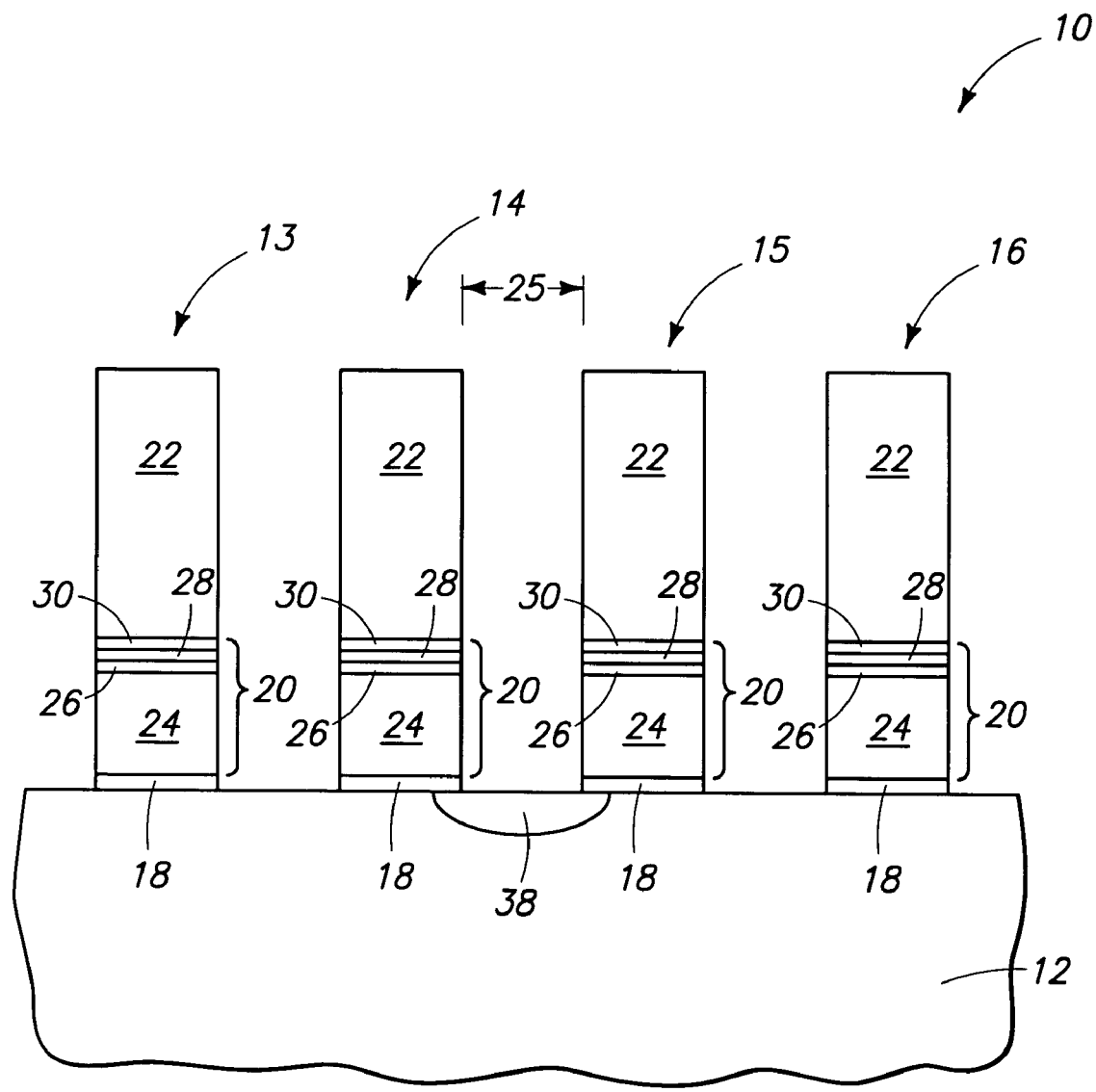
FIG. 4 is a view of the FIG. 3 substrate fragment at a processing step subsequent to that shown by FIG. 3.

Referring to FIG. 4, patterned photoresist layer 32 has been removed from substrate 12 after the ion implanting.

Such removing might be by any existing or yet-to-be developed technique. One exemplary existing technique is by oxygen plasma ashing. Typically and preferably, the removing of patterned photoresist layer 32 will reduce the degree of lateral separation of the outermost portions of features 14 and 15 from what it was when patterned photoresist layer 32 was received thereover. Such reduction of the degree of lateral separation might only be partial, or might also preferably be to what it was prior to the formation of the patterned photoresist layer. FIG. 4 depicts exemplary processing whereby the lateral separation 35 of FIG. 2 has been reduced back to the lateral separation 25 of FIG. 1. Of course, aspects of the invention contemplate no reduction of the degree of lateral separation, and reduction of the degree of lateral separation to some value other than the starting value prior to formation of the photoresist.

Lateral pulling of at least the outermost portions of adjacent spaced features, or other features, might occur by any method disclosed herein, or by subsequently developed methods. Factors discovered to impact the degree of lateral pulling of spaced features include resist composition and the height of the spaced features. For example, taller features tend to result in a greater degree of lateral pulling. Further, resist compositions which tend to undergo a higher degree of shrinkage upon all processing after deposition tend to result in greater lateral pulling than those which exhibit less shrinkage. Further and regardless of feature height and resist composition, reducing pre-exposure bake temperature and/or pre-exposure bake time tends to increase subsequent shrinkage, and thereby the degree of lateral pulling of adjacent spaced features. Likewise and regardless, increasing at least one of post-exposure bake temperature and/or time tends to maximize shrinkage, and thereby lateral pulling of the outermost portions of spaced adjacent spaced features. Further and regardless, thicker photoresist layers tend towards greater lateral pulling than do thinner photoresist layers.

In another considered aspect of the invention, an ion implanting method includes the formation of a pair of spaced and adjacent features projecting outwardly from a substrate, for example and by way of example only as described above in connection with FIG. 1. A first set of photoresist processing parameters are determined which would, upon forming a patterned photoresist layer over the features having an opening therein received intermediate the features, result in a first lateral separation of the outermost portion of the features of the pair. For example and by way of example only, the first set of photoresist processing parameters could be determined which results in a first lateral separation of the outermost portions of the pair of spaced features which is the same as that when such features are initially formed, or result in some first lateral separation which is greater or less than the lateral separation of the spaced features as initially formed. Such first set of photoresist processing parameters would likely include one or more combinations of photoresist layer thickness, pre-exposure processing, post-exposure processing, etc., for example as described above.

Determining such first set of photoresist processing parameters might occur by forming a photoresist layer over a substrate having the features and measuring what, if any, degree of lateral pulling occurs from the processing parameters utilized. The might not be the very substrate over which subsequent processing occurs, or might be such substrate. Alternately, the determining of the first set of processing parameters might be by computer or other modeling without necessarily actually requiring photoresist formation over any substrate.

Thereafter, a patterned photoresist layer is formed over the features using a second set of photoresist processing parameters which results in a second lateral separation of the outermost portions of the features which is greater than the first lateral separation. By way of example only, such is depicted in connection with FIG. 2. In one implementation, the second set of photoresist processing parameters comprises a thickness of the patterned photoresist layer which is greater than that in the first set of photoresist processing parameters. In one implementation, the second set of photoresist processing parameters comprises at least one of a pre-exposure bake temperature and a pre-exposure bake time which is less than that in the first set of photoresist processing parameters. In one implementation, the second set of photoresist processing parameters comprises at least one of a post-exposure bake temperature and a post-exposure bake time which is greater than that in the first set of photoresist processing parameters. Any of such variously stated photoresist processing parameters of the first and second sets could also, of course, be combined.

While the patterned photoresist layer is over the features, a species is ion implanted into substrate material which is received lower than the pair of spaced features, for example as has been shown and is described above in connection with FIG. 3.

After the ion implanting, the patterned photoresist layer is removed from the substrate, for example as is shown in FIG. 4 and has been described above. Typically and preferably, such removing of the patterned photoresist layer will reduce the degree of lateral separation of the outermost portions of the features of the pair from what it was when the patterned photoresist layer was received over the features. Exemplary preferred processing is otherwise as described above in connection with the first-described implementations and aspects of the invention.

Figure 5:
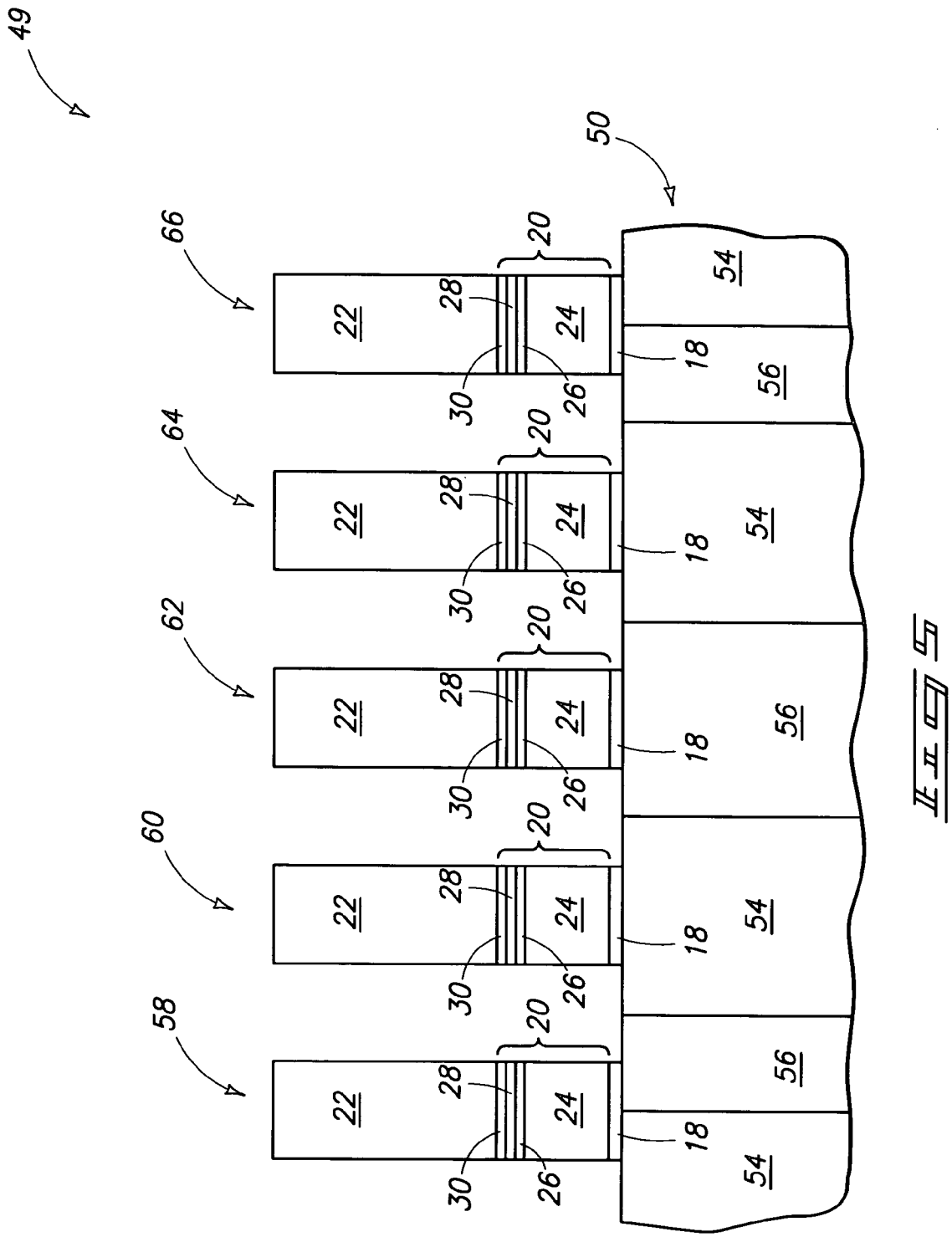
FIG. 5 is a diagrammatic sectional view of an alternate embodiment substrate fragment in process in accordance with an aspect of the invention.

Another exemplary ion implanting method in accordance with aspects of the invention is described with reference to FIGS. 5-9. FIGS. 5 and 6 depict a substrate fragment 49 comprising a substrate 50. Substrate 50 comprises semiconductive active area regions 54, and intervening electrically insulative isolation regions 56 for example comprising one or more of silicon dioxide and silicon nitride. A plurality of features 58, 60, 62, 64 and 66 are shown formed and projecting outwardly from substrate 50. In the depicted exemplary embodiment, such comprise field effect transistor gate stacks, for example having the same exemplary construction and designation as those of the first-described embodiment. Again, the features might be of the same size and shape, or of different at least one of size and shape. In one exemplary preferred embodiment, the features have aspect ratios of at least 3.0 and, in another implementation, have aspect ratios of at least 4.0. The separation distance between immediately adjacent features might be the same as that of the width of the depicted features, or different. For purposes of the continuing discussion, features 60, 62 and 64 can be considered as comprising first, second, and third features projecting outwardly from substrate 50, and wherein second feature 62 is received intermediate first feature 60 and third feature 64. In one implementation, feature 62 comprises a dummy gate. A "dummy gate" in the context of this document is a gate line not forming an operable part of the operable circuitry, and which may be grounded or otherwise held to a non-operable potential during circuitry operation. Such might be provided during circuitry fabrication to facilitate fabrication of consistent shape gate lines and spacing between gate lines.

Referring to FIG. 7, at least the outermost portions of first feature 60 and third feature 64 have been laterally pulled inward toward second feature 62 with a patterned photoresist layer 70 received over the first, second, and third features 60, 62 and 64, respectively. Patterned photoresist layer 70 preferably has the same attributes as those described in connection with the first-described embodiment with respect to photoresist layer 32. Further preferably, processing can be conducted as described above for imparting the described lateral pulling. Patterned photoresist layer 70 is received entirely over second feature 62, and is bridging between first feature 60 and third feature 64 in the depicted cross section. Further, patterned photoresist layer 70 exposes laterally outer sidewalls 67 of first feature 60 and third feature 64. Preferably, the lateral pulling of the outermost portions of each of the first and third features is from 1° to 10° from orthogonal to the substrate, with a more narrow preferred range being from 5° to 8° from orthogonal to the substrate. Patterned photoresist layer 70 is preferably received over less than all of first feature 60 and third feature 64, as shown. Such patterned photoresist layer might be received over about 50% of each of the first and third features, over less than 50% of each of the first and third features, or over more than 50% of each of the first and third features. By way of example only, FIG. 7 depicts patterned photoresist layer 70 being received over about 40% of each of the first and third features.

Referring to FIG. 8, and while the first and third features are laterally pulled by patterned photoresist layer 70, a species has been ion implanted into substrate material laterally outward of and adjacent first feature 60 and third feature 64, and which is received lower than first feature 60 and third feature 64, thereby forming the illustrated implant regions 75. Such ion implanting might be conducted orthogonal to the substrate, whereby typically the implanted regions would include very little, if any, portion received directly beneath the first and third features at least as-implanted. Alternately and more preferably as shown, the ion implanting is conducted at an angle from orthogonal to the substrate, and thereby, into substrate material received beneath the first and third features. The angle of ion implanting, if other than orthogonal, might be at the same angular degree of the outermost portions of features 60 and 64 resulting from the pulling, or might be at an angle greater or less than such angular degree of pulling. Implanting whether orthogonal or at an angle from orthogonal, for example, is preferably as described above in connection with the first-described embodiments.

Referring to FIG. 9 and after the ion implanting, patterned photoresist layer 70 (not shown) has been removed from the substrate. As with the first-described embodiment, such removing of the patterned photoresist layer typically and preferably reduces the degree of lateral separation of the outermost portions of the first and third features from the second feature. Such reduction of the degree of lateral separation might be only partial, or completely to what it was prior to the formation of the patterned photoresist layer. Processing is otherwise preferably as described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An ion implanting method, comprising:
    forming a pair of spaced and adjacent features projecting outwardly from a substrate;
    using a patterned photoresist layer received over the features to laterally pull at least outermost portions of the pair of spaced features away from one another by lateral pulling action of the patterned photoresist layer on at least the outermost portions of the pair of spaced features, the patterned photoresist layer having an opening therein received intermediate the pair of spaced features;
    while said spaced features are laterally pulled, ion implanting a species into substrate material which is received lower than the pair of spaced features; and
    after the ion implanting, removing the patterned photoresist layer from the substrate.

2. The method of claim 1 wherein the features are of the same size and shape.

3. The method of claim 1 wherein the features are of different at least one of size and shape.

4. The method of claim 1 wherein the features comprise field effect transistor gate stacks comprising a gate dielectric layer, a conductive layer and an insulative cap.

5. The method of claim 1 wherein the features of the pair have aspect ratios of at least 3.0, and a space therebetween having an aspect ratio of at least 3.0.

6. The method of claim 1 wherein the features of the pair have aspect ratios of at least 4.0, and a space therebetween having an aspect ratio of at least 4.0.

7. The method of claim 1 wherein the patterned photoresist layer comprises an organic photoresist.

8. The method of claim 1 wherein the lateral pulling of the outermost portions of each of the features of the pair is from 1° to 10° from orthogonal to the substrate.

9. The method of claim 8 wherein the lateral pulling of the outermost portions of each of the features of the pair is from 5° to 8° from orthogonal to the substrate.

10. The method of claim 1 wherein the ion implanting is conducted at an angle from orthogonal to the substrate, and is into substrate material received beneath the features of the pair.

11. The method of claim 10 wherein the ion implanting angle is equal to angle from orthogonal of the outermost portions of the pair of spaced features resulting from said lateral pulling.

12. The method of claim 10 wherein the ion implanting angle is greater than angle from orthogonal of the outermost portions of the pair of spaced features resulting from said lateral pulling.

13. The method of claim 10 wherein the ion implanting angle is less than angle from orthogonal of the outermost portions of the pair of spaced features resulting from said lateral pulling.

14. The method of claim 1 wherein the patterned photoresist layer is received over less than all of each of the features of the pair.

15. The method of claim 14 wherein the patterned photoresist layer is received over about 50% of each of the features of the pair.

16. The method of claim 14 wherein the patterned photoresist layer is received over less than 50% of each of the features of the pair.

17. The method of claim 14 wherein the patterned photoresist layer is received over more than 50% of each of the features of the pair.

18. An ion implanting method, comprising:
forming a pair of spaced and adjacent features projecting outwardly from a substrate;
laterally pulling at least outermost portions of the pair of spaced features away from one another with a patterned photoresist layer received over the features and which has an opening therein received intermediate the pair of spaced features;
while said spaced features are laterally pulled, ion implanting a species into substrate material which is received lower than the pair of spaced features; and
after the ion implanting, removing the patterned photoresist layer from the substrate, the removing of the patterned photoresist layer reducing degree of lateral separation of the outermost portions of the features of the pair from what is was when the patterned photoresist layer was received over the features of the pair.

19. The method of claim 18 wherein the removing of the patterned photoresist layer reduces degree of lateral separation of the outermost portions of the features to what it was prior to formation of said patterned photoresist layer.

20. An ion implanting method, comprising:
forming a pair of spaced and adjacent features projecting outwardly from a substrate;
laterally pulling at least outermost portions of the pair of spaced features away from one another from 10 to 100 from orthogonal to the substrate with a patterned photoresist layer received over the features and which has an opening therein received intermediate the pair of spaced features, the features of the pair having aspect ratios of at least 3.0 and a space therebetween having an aspect ratio of at least 3.0;
while said spaced features are laterally pulled, ion implanting a species into substrate material which is received lower than the pair of spaced features; said ion implanting being conducted at an angle from orthogonal to the substrate and into substrate material received beneath the features of the pair; and
after the ion implanting, removing the patterned photoresist layer from the substrate; said removing of the patterned photoresist layer reducing degree of lateral separation of the outermost portions of the features of the pair from what is was when the patterned photoresist layer was received over the features of the pair.

21. An ion implanting method, comprising:
forming a pair of spaced and adjacent features projecting outwardly from a substrate;
determining a first set of photoresist processing parameters which would, upon forming a patterned photoresist layer over the features having an opening therein received intermediate the features, result in a first lateral separation of outermost portions of the features of the pair;
forming the patterned photoresist layer over the features using a second set of photoresist processing parameters which results in a second lateral separation of the outermost portions of the features which is greater than the first lateral separation, said second lateral separation resulting at least in part from lateral pulling action by the patterned photoresist layer formed by the second set of photoresist processing parameters on at least the outermost portions of the features;
while the patterned photoresist layer formed by the second set of photoresist processing parameters is over the features, ion implanting a species into substrate material which is received lower than the pair of spaced features; and
after the ion implanting, removing the patterned photoresist layer from the substrate.

22. The method of claim 21 wherein the second set of photoresist processing parameters comprises a thickness of the patterned photoresist layer which is greater than that in the first set of photoresist processing parameters.

23. The method of claim 21 wherein the second set of photoresist processing parameters comprises at least one of a pre-exposure bake temperature and a pre-exposure bake time which is less than that in the first set of photoresist processing parameters.

24. The method of claim 23 wherein the second set of photoresist processing parameters comprises a pre-exposure bake temperature which is less than that in the first set of photoresist processing parameters.

25. The method of claim 23 wherein the second set of photoresist processing parameters comprises a pre-exposure bake time which is less than that in the first set of photoresist processing parameters.

26. The method of claim 23 wherein the second set of photoresist processing parameters comprises a pre-exposure bake temperature and a pre-exposure bake time which are less than that in the first set of photoresist processing parameters.

27. The method of claim 21 wherein the second set of photoresist processing parameters comprises at least one of a post-exposure bake temperature and a post-exposure bake time which is greater than that in the first set of photoresist processing parameters.

28. The method of claim 27 wherein the second set of photoresist processing parameters comprises a post-exposure bake temperature which is greater than that in the first set of photoresist processing parameters.

29. The method of claim 27 wherein the second set of photoresist processing parameters comprises a post-exposure bake time which is greater than that in the first set of photoresist processing parameters.

30. The method of claim 27 wherein the second set of photoresist processing parameters comprises a post-exposure bake temperature and a post-exposure bake time which are greater than that in the first set of photoresist processing parameters.

31. The method of claim 21 wherein the ion implanting is conducted at an angle from orthogonal to the substrate, and is into substrate material received beneath the features of the pair.

32. The method of claim 31 wherein the ion implanting angle is equal to angle from orthogonal of the outermost portions of the pair of spaced features resulting from said lateral pulling.

33. The method of claim 31 wherein the ion implanting angle is greater than angle from orthogonal of the outermost portions of the pair of spaced features resulting from said lateral pulling.

34. The method of claim 31 wherein the ion implanting angle is less than angle from orthogonal of the outermost portions of the pair of spaced features resulting from said lateral pulling.

35. The method of claim 21 wherein the features are of the same size and shape.

36. The method of claim 21 wherein the features are of different at least one of size and shape.

37. The method of claim 21 wherein the features comprise field effect transistor gate stacks comprising a gate dielectric layer, a conductive layer and an insulative cap.

38. The method of claim 21 wherein the features of the pair have aspect ratios of at least 3.0, and a space therebetween having an aspect ratio of at least 3.0.

39. The method of claim 21 wherein the features of the pair have aspect ratios of at least 4.0, and a space therebetween having an aspect ratio of at least 4.0.

40. The method of claim 21 wherein the patterned photoresist layer comprises an organic photoresist.

41. The method of claim 21 wherein the patterned photoresist layer is received over less than all of each of the features of the pair.

42. The method of claim 41 wherein the patterned photoresist layer is received over about 50% of each of the features of the pair.

43. The method of claim 41 wherein the patterned photoresist layer is received over less than 50% of each of the features of the pair.

44. The method of claim 41 wherein the patterned photoresist layer is received over more than 50% of each of the features of the pair.

45. An ion implanting method, comprising:
forming a pair of spaced and adjacent features projecting outwardly from a substrate;
determining a first set of photoresist processing parameters which would, upon forming a patterned photoresist layer over the features having an opening therein received intermediate the features, result in a first lateral separation of outermost portions of the features of the pair;
forming the patterned photoresist layer over the features using a second set of photoresist processing parameters which results in a second lateral separation of the outermost portions of the features which is greater than the first lateral separation;
while the patterned photoresist layer formed by the second set of photoresist processing parameters is over the features, ion implanting a species into substrate material which is received lower than the pair of spaced features;
after the ion implanting, removing the patterned photoresist layer from the substrate;
the second set of photoresist processing parameters comprising at least one of a pre-exposure bake temperature and a pre-exposure bake time which is less than that in the first set of photoresist processing parameters; and
the second set of photoresist processing parameters comprising at least one of a post-exposure bake temperature and a post-exposure bake time which is greater than that in the first set of photoresist processing parameters.

46. An ion implanting method, comprising:
forming a pair of spaced and adjacent features projecting outwardly from a substrate;
determining a first set of photoresist processing parameters which would, upon forming a patterned photoresist layer over the features having an opening therein received intermediate the features, result in a first lateral separation of outermost portions of the features of the pair;
forming the patterned photoresist layer over the features using a second set of photoresist processing parameters which results in a second lateral separation of the outermost portions of the features which is greater than the first lateral separation;
while the patterned photoresist layer formed by the second set of photoresist processing parameters is over the features, ion implanting a species into substrate material which is received lower than the pair of spaced features;
after the ion implanting, removing the patterned photoresist layer from the substrate; the removing of the patterned photoresist layer reducing degree of lateral separation of the outermost portions of the features of the pair from what is was when the patterned photoresist layer was received over the features of the pair.

47. The method of claim 46 wherein the removing of the patterned photoresist layer reduces degree of lateral separation of the outermost portions of the features to what it was prior to formation of said patterned photoresist layer.

48. An ion implanting method, comprising:
forming first, second, and third features projecting outwardly from a substrate; the second feature being received intermediate the first and third features;
using a patterned photoresist layer received over the first, second, and third features to laterally pull at least outermost portions of the first and third features laterally inward toward the second feature by lateral pulling action of the patterned photoresist layer on at least the outermost portions of first and third features; the patterned photoresist layer being received entirely over the second feature and bridging between the first and third features; the patterned photoresist layer exposing laterally outer sidewalls of the first and third features;
while said first and third features are laterally pulled, ion implanting a species into substrate material laterally outward of and adjacent the first and third features and which is received lower than the first and third features; and
after the ion implanting, removing the patterned photoresist layer from the substrate.

49. The method of claim 48 wherein the first, second, and third features comprise field effect transistor gate stacks comprising a gate dielectric layer, a conductive layer and an insulative cap.

50. The method of claim 49 wherein the second feature comprises a dummy gate.

51. The method of claim 48 wherein the first, second, and third features are of the same size and shape.

52. The method of claim 48 wherein the first, second, and third features are of different at least one of size and shape.

53. The method of claim 48 wherein the first, second, and third features have aspect ratios of at least 3.0.

54. The method of claim 48 wherein the first, second, and third features have aspect ratios of at least 4.0.

55. The method of claim 48 wherein the patterned photoresist layer comprises an organic photoresist.

56. The method of claim 48 wherein the lateral pulling of the outermost portions of each of the first and third features is from 1° to 10° from orthogonal to the substrate.

57. The method of claim 56 wherein the lateral pulling of the outermost portions of each of the first and third features is from 5° to 8° from orthogonal to the substrate.

58. The method of claim 48 wherein the removing of the patterned photoresist layer reduces degree of lateral separation of the outermost portions of the first and third features from the second feature from what it was when the patterned photoresist layer was received over the first, second, and third features.

59. The method of claim 58 wherein the removing of the patterned photoresist layer reduces degree of lateral separation of the outermost portions of the first and third features from the second feature to what it was prior to formation of said patterned photoresist layer.

60. The method of claim 48 wherein the ion implanting is conducted at an angle from orthogonal to the substrate, and into substrate material received beneath the first and third features.

61. The method of claim 60 wherein the ion implanting angle is equal to angle from orthogonal of the outermost portions of the pair of spaced features resulting from said lateral pulling.

62. The method of claim 60 wherein the ion implanting angle is greater than angle from orthogonal of the outermost portions of the pair of spaced features resulting from said lateral pulling.

63. The method of claim 60 wherein the ion implanting angle is less than angle from orthogonal of the outermost portions of the pair of spaced features resulting from said lateral pulling.

64. The method of claim 48 wherein the patterned photoresist layer is received over less than all of each of the first and third features.

65. The method of claim 64 wherein the patterned photoresist layer is received over about 50% of each of the first and third features.

66. The method of claim 64 wherein the patterned photoresist layer is received over less than 50% of each of the first and third features.

67. The method of claim 64 wherein the patterned photoresist layer is received over more than 50% of each of the first and third features.

* * * * *

UNITED STATES PATENT AND TRADEMARK OFFICE
CERTIFICATE OF CORRECTION

PATENT NO. : 7,329,618 B2  Page 1 of 1
APPLICATION NO. : 11/168893
DATED : February 12, 2008
INVENTOR(S) : Culver et al.

It is certified that error appears in the above-identified patent and that said Letters Patent is hereby corrected as shown below:

In column 9, line 19, in Claim 18, after "what" delete "is" and insert -- it --, therefor.

In column 9, line 29, in Claim 20, delete "10 to 100" and insert -- 1° to 10° --, therefor.

In column 9, line 46, in Claim 20, after "what" delete "is" and insert -- it --, therefor.

In column 12, line 10, in Claim 46, after "what" delete "is" and insert -- it --, therefor.

Signed and Sealed this

Seventeenth Day of June, 2008

JON W. DUDAS
*Director of the United States Patent and Trademark Office*